(12) United States Patent
Kitazawa et al.

(10) Patent No.: US 6,201,557 B1
(45) Date of Patent: Mar. 13, 2001

(54) THERMAL PRINTING HEAD, PROCESS FOR PRODUCING THERMAL PRINTING HEAD, RECORDER, SINTER AND TARGET

(75) Inventors: Yusuke Kitazawa, Yokohama; Yasuhisa Takamura, Fujisawa, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/117,827

(22) PCT Filed: Feb. 10, 1997

(86) PCT No.: PCT/JP97/00344

§ 371 Date: Mar. 16, 1999

§ 102(e) Date: Mar. 16, 1999

(87) PCT Pub. No.: WO97/28965

PCT Pub. Date: Aug. 14, 1997

(30) Foreign Application Priority Data

Feb. 8, 1996 (JP) .................................. 8-022737

(51) Int. Cl.[7] .................. B41J 2/34; B41J 2/335
(52) U.S. Cl. .......................... 347/203; 347/201
(58) Field of Search ........................ 347/204, 201, 347/203

(56) References Cited

U.S. PATENT DOCUMENTS

| | | |
|---|---|---|
| 4,388,085 | 6/1983 | Sarin et al. . |
| 4,768,038 | 8/1988 | Shibata . |
| 4,772,520 | 9/1988 | Takeno et al. . |
| 4,786,916 | 11/1988 | Kato . |
| 4,804,974 | * 2/1989 | Sugata et al. . |
| 5,376,602 | 12/1994 | Nilsen . |
| 5,420,612 | * 5/1995 | Brock et al. ........................ 347/201 |
| 5,995,127 | * 11/1999 | Uzuka ................................ 347/204 |

FOREIGN PATENT DOCUMENTS

| | | |
|---|---|---|
| 0 367 122 | 5/1990 | (EP) . |
| 62-116162 | 5/1987 | (JP) . |
| 63-185644 | 8/1988 | (JP) . |
| 1-202465 | 8/1989 | (JP) . |
| 2-47261 | 2/1990 | (JP) . |
| 5-311413 | 11/1993 | (JP) . |

OTHER PUBLICATIONS

Copy of Communication dated Mar. 5, 1999, issued from the European Patent Office GM/YG/98084EP.

* cited by examiner

Primary Examiner—N. Le
Assistant Examiner—K. Feggins
(74) Attorney, Agent, or Firm—Finnegan, Henderson, Farabow, Garrett & Dunner, L.L.P.

(57) ABSTRACT

A process for producing a protective layer or a primer layer for a heat-generating resistor for a thermal head by sputtering using a target comprising a sinter of a silicon nitride/silicon dioxide/magnesium oxide powder. By regulating the particle diameter of the powder, the target is prevented from suffering partial peeling during the sputtering.

26 Claims, 4 Drawing Sheets

THERMAL PRINTING HEAD, PROCESS FOR PRODUCING THERMAL PRINTING HEAD, RECORDER, SINTER AND TARGET

TECHNICAL FIELD

The invention relates to a thermal printing head to be used for various types of office automation equipment represented by a facsimile or stencil printing, a process for producing the thermal printing head, a recorder using the thermal printing head, a sinter suitably used to form a protective layer and a primer layer for a heat-generating resistor configuring the thermal printing head, and a target.

BACKGROUND ART

Recently, the thermal printing head, which has advantages such as a low noise, a low maintenance cost and a low running cost, is extensively used for thermal recorders of various types of OA equipment such as a facsimile or stencil printing.

Generally, the thermal printing head has the following structure. Specifically, a glaze glass layer is formed on an alumina substrate, a heat-generating resistor layer and a conductive layer such as aluminum are formed on the glaze glass layer, and a heat-generating resistor and an electrode are formed by a photoengraving process. Besides, it has a structure in which a protective layer for protecting the heat-generating resistor and the electrode is formed by a film forming technology such as a sputtering process. And, in order to prevent oxygen from dispersing from the glaze glass layer to the heat-generating resistor and to retain the properties of the heat-generating resistor, a primer layer for a heat-generating resistor may be additionally formed between the glaze glass layer and the heat-generating resistor formed on the alumina substrate.

The protective layer and the primer layer for the heat-generating resistor are formed by the film forming technology such as the sputtering process using, for example, powder of a sinter comprising silicon nitride and silicon dioxide as a target, but a foreign matter (splash) may be captured into the protective layer and the primer layer for the heat-generating resistor while the protective layer and the primary layer for the heat-generating resistor are formed. The foreign matter includes floating dust present in the atmosphere where the thermal printing head is produced or dust dispersed from the production machine, human bodies or the like and adhered to the top/bottom layers and into the layers of the protective layer for the thermal printing head and the primary layer for the heat-generating resistor. Especially, the sinter, which is used as the target, is a problem as the cause to produce the foreign matter.

Specifically, the thermal printing head manufacturing environment is designed to keep higher cleanness as compared with conventional cleanness, owing to the progress of the cleaning technology on a cleaning room and the like, and the floating dust and the dust from the manufacturing machine and the human body are mostly removed. However, when the protective layer and the primary layer for the heat-generating resistor are formed by the sputtering process or the like, the foreign matter which is dispersed from the sinter used as the target to adhere to the protective layer and the primary layer for the heat-generating resistor is hardly removed. Therefore, the foreign matter dispersed from the sinter adheres to the protective layer and the primary layer for the heat-generating resistor. The protective layer and the primary layer for the heat-generating resistor capture the foreign matter. The foreign matter is produced from the sinter used as the target because a difference in size of particles forming the sinter and a partial difference in density of the sinter due to pores cause partial deviation of atoms, which are consumed from the sinter when the film is formed, to form fine irregularities on the surface of the sinter, and especially to separate a part of the sinter due to an abnormal electric discharge produced on the protruded portions. In other words, a portion of the separated sinter disperses as the foreign matter from the sinter to adhere to the protective layer and the primary layer for the heat-generating resistor.

Thus, in the thermal printing head containing a part of the sinter as the foreign matter in the protective layer, the foreign matter comes in contact with a recording medium and is separated from the protective layer, causing a pinhole at he position of the protective layer where the foreign matter s separated. And, if the separated foreign matter were captured into the periphery of the separated position, the protective layer of the pertinent periphery is broken.

Moisture, a corrosive substance or the like is easy to enter into the pinhole and the broken part of the protective layer formed as described above to cause a problem that the electrode or the heat-generating resistor is corroded or deteriorated, resulting in impairing the properties of the thermal printing head.

And, if the foreign matter were captured into the primary layer for the heat-generating resistor, the heat-generating resistor layer and the like formed on the primary layer for the heat-generating resistor particularly suffers from a defect and has drawbacks that the heat-generating resistor has a defect in its property such as a resistance value and its quality such as service life.

In addition, there was a problem that quality of an image printed on a printing medium by a recorder was degraded because quality such as the feature or service life of the thermal printing head mounted on the recorder was affected.

The present invention was completed to remedy the above-described problems, and aims to provide a thermal printing head which reduces pinholes to be formed in the protective layer and the primary layer for the heat-generating resistor or a breakage to be caused in the protective layer and the primary layer for the heat-generating resistor and has an excellent environmental resistance, high reliability and a high quality level.

It is also an object of the present invention to provide a thermal printing head, which retains the properties and quality of the heat-generating resister and has a high reliability and a high quality level.

It is another object of the present invention to provide a process for producing a thermal printing head which reduces a pinhole formed in the protective layer or a breakage caused in the protective layer and has excellent environmental resistance, high reliability and a high quality level.

It is still an object of the present invention to provide a process for producing a thermal printing head, which retains the properties and quality of the heat-generating resister and has high reliability and a high quality level.

Furthermore, it is an object of the present invention to provide a recorder which mounts a thermal printing head, which retains the properties and quality of the heat-generating resister and has high reliability and a high quality level, and stably outputs a high-quality recorded image.

Besides, it is an object of the present invention to provide a recorder which mounts a thermal printing head, which reduces a pinhole to be formed in the protective layer or a breakage to be caused in the protective layer and has an excellent environmental resistance, high reliability and a high quality level, and stably outputs a high-quality recorded image.

In addition, it is an object of the invention to provide a sinter which can be used suitably to form the protective layer or the primary layer for the heat-generating resistor of the thermal printing head.

And, it is also an object of the invention to provide a target which can be used suitably to form the protective layer or the primary layer for the heat-generating resistor of the thermal printing head.

DISCLOSURE OF INVENTION

A thermal printing head according to a first aspect of the invention comprises: a supporting substrate; a heat-generating resistor disposed on the supporting substrate; an electrode connected to the heat-generating resistor; and a protective layer which is formed to cover the heat-generating resistor and the electrode by sputtering with a sinter of powder, which comprises silicon nitride, silicon dioxide and magnesium oxide having an average particle diameter of 1.0 µm or below used as a target.

According to the thermal printing head of the first aspect of the invention, the protective layer for covering the heat-generating resistor and the electrode is formed by using sputtering with the sinter of powder comprising silicon nitride, silicon dioxide and magnesium oxide having an average particle diameter of 1.0 µm or below used as a target, so that a foreign matter (splash) due to the target can be prevented from being produced, and the protective layer can be produced with the foreign matter prevented from being captured.

And, a thermal printing head according to a second aspect of the invention comprises a supporting substrate; a glaze glass layer disposed on the supporting substrate; a primer layer for a heat-generating resistor, the primer layer formed on the glaze glass layer by sputtering with a sinter of powder, which comprises silicon nitride, silicon dioxide and magnesium oxide having an average particle diameter of 1.0 µm or below used as a target; the heat-generating resistor disposed on the supporting substrate; an electrode connected to the heat-generating resistor; and a protective layer which is formed to cover the heat-generating resistor and the electrode by sputtering with a sinter of powder, which comprises silicon nitride, silicon dioxide and magnesium oxide having an average particle diameter of 1.0 µm or below used as a target.

According to the thermal printing head of the second aspect of the invention, the primer layer for the heat-generating resistor on the glaze glass layer and the protective layer covering the heat-generating resistor and the electrode are formed by using sputtering with the sinter of powder comprising silicon nitride, silicon dioxide and magnesium oxide having an average particle diameter of 1.0 µm or below used as a target, so that a foreign matter (splash) due to the target can be prevented from being produced, the primer layer for the heat-generating resistor and the protective layer can be obtained with the foreign matter prevented from being captured.

As described above, if a foreign matter is captured into the protective layer and the primer layer for the heat-generating resistor, the thermal printing head has structural and functional defects. However, according to the first and second thermal printing heads of the present invention, since the capturing of a foreign matter into the protective layer is prevented, the protective layer excels in hardness and abrasion resistance, and it is also excellent in the surface condition and uniformity of thickness, its environmental resistance, durability and reliability can also be highly improved. Besides, according to the second thermal printing head of the invention, since the foreign matter is suppressed from being captured into the primer layer for the heat-generating resistor, the heat-generating resistor's primer layer excels in the surface condition and uniformity of thickness, and the heat-generating resistor can be made to have a uniform thickness, so that the resistance value can be suppressed from being variable depending on portions of the heat-generating resistor. And, since the heat-generating resistor's primer layer excels in chemical and physical stability, the heat-generating resistor can be prevented from being deteriorated with time, and the heat-generating resistor can have an improved service life. In addition, since the heat-generating resistor's primer layer can effectively seal oxygen and the like from dispersing from the glaze glass layer, the resistance value of the heat-generating resistor can be prevented from being varied due to the glaze glass layer.

Here, the surface of a substance can be defined as an aggregate of surface atoms that when a certain substance is placed in a vacuum, no other atom can be found in a sufficient distance in at least a specified direction when viewed from the center of atoms configuring the substance. And, thickness shall be specified by shape thickness ($d_T$), which is determined by a combination of a substrate surface ($S_S$) specified as an average surface of aggregate ($G_S$) of the surface atoms on one side of a substrate 18 and a shape surface ($S_T$) of a film 19 specified as an average surface of the film 19 on the side opposite to the substrate 18 as shown in FIG. 4. When an aggregate (G) of all subject surface atoms is available, an arbitrary plane (S) is assumed and determined as an average surface of G when the position of S is decided so that a sum of the squares of distances from all points of G becomes minimum.

According to the first and second aspects of the invention, the protective layer and the heat-generating resistor's primer layer are generally formed to have a thickness of 1.0 to 10.0 µm and 1.0 to 5.0 µm. But, the protective layer is formed so that a distance (e.g., $d_1$, $d_2$ and the like in Table 4) from a point on the surface (an aggregate of surface atoms opposed to the heat-generating resistor and the electrode) of the protective layer to a shape surface of the protective layer falls in a range of 0.1 to 0.5 µm, and the heat-generating resistor's primer layer is formed so that a distance from a point on the surface (an aggregate of surface atoms opposed to the glaze glass layer) of the heat-generating resistor's primer layer to a shape surface of the heat-generating resistor's primer layer falls in a range of 0.1 to 0.5 µm.

In the thermal printing heads according to the first and second aspects of the invention, the target, namely the sinter, which is used to form the protective layer and the heat-generating resistor's primer layer, has silicon nitride and silicon dioxide as main components, but magnesium oxide having an average particle diameter of 1 µm or below is added to powder to be a material for the sinter. Therefore, the target has an improved density, and a foreign matter (splash) can be prevented from producing in sputtering. And, by adding magnesium oxide having an average particle diameter of 1 µm or below to the powder to be the material for the sinter, the film to be formed by sputtering using the sinter has an enhanced hardness. In order to improve a density of the target and to suppress a foreign matter from being produced in sputtering, magnesium oxide to be added to the powder as the material for the sinter preferably has an average particle diameter of 0.1 to 0.5 µm. This point will be described in detail.

FIG. 5 shows the relationship between an average particle diameter of magnesium oxide added to the powder as the material for the sinter and a density of the sinter (the solid line in the drawing) and the relationship between an average particle diameter of magnesium oxide and hardness of the film formed using the sinter obtained by adding the magnesium oxide as the target (the broken line in the drawing). In FIG. 5, an added amount of the magnesium oxide was fixed to be 0.5% by weight of the powder. And, the sinter was formed by cold pressing.

As shown in FIG. 5, a counter-theoretical density ratio of the sinter becomes maximum when the magnesium oxide has an average particle diameter of about 0.04 $\mu$m and lowers little by little with the increase of an average particle diameter of magnesium oxide. When the magnesium oxide has an average particle diameter of 1 $\mu$m or below, the sinter has a counter-theoretical density ratio of about 90%, but when the magnesium oxide has an average particle diameter of more than 1 $\mu$m, the obtained sinter has a smaller counter-theoretical density ratio. On the other hand, the film formed by using the sinter as the target obtained by adding the magnesium oxide has hardness, which is substantially constant when the magnesium oxide has an average particle diameter of 1 $\mu$m or below but becomes small sharply when the magnesium oxide has an average particle diameter of more than 1 $\mu$m. Therefore, by adjusting the magnesium oxide to have an average particle diameter of 1 $\mu$m or below, the sinter having a large counter-theoretical density ratio can be obtained, and a foreign matter (splash) can be prevented from producing when sputtering is performed using the sinter as the target. And, hardness of the film, which is formed using the sinter as the target, is also fixed to the neighborhood of the maximum value. Furthermore, by setting the average particle diameter of the magnesium oxide to 0.1 to 0.5 $\mu$m, the sinter having a large counter-theoretical density ratio can be obtained stably, and the production of a foreign matter (splash) can be prevented without fail when sputtering is performed using the sinter as the target. At the same time, the hardness of the film formed using the sinter as the target is also fixed to the neighborhood of the maximum value. The results shown in FIG. 5 had substantially the same tendency regardless of a type of sputtering. And, the average particle diameter is defined as an average of the diameter in a single material, which configures the powder.

When the magnesium oxide is added to the powder which is material for the sinter, in order to improve a density of the sinter conspicuously and to keep hardness of the film which is formed by sputtering using the sinter as a target, the magnesium oxide is desirably added to the powder in an amount of 0.01 to 5.0% by weight, and more preferably 0.1 to 0.5% by weight. This point will be described in detail.

FIG. 6 shows the relationship between an amount of the magnesium oxide added to the powder as the material for the sinter and a density of the sinter (the solid line in the drawing) and the relationship between an added amount of the magnesium oxide and hardness of the film formed using the sinter obtained by adding the magnesium oxide as the target (the broken line in the drawing). In FIG. 6, an average particle diameter of the added magnesium oxide was fixed to be 0.1 $\mu$m. And, the sinter was formed by cold pressing.

As shown in FIG. 6, a counter-theoretical density ratio of the sinter increases sharply with the addition of magnesium oxide and becomes maximum when the magnesium oxide is added in an amount of about 0.3% by weight but lowers then when the addition of the magnesium oxide increases. On the other hand, the film formed by using the sinter as the target obtained by adding the magnesium oxide has hardness, which increases with the addition of the magnesium oxide and is substantially constant until the magnesium oxide is added in an amount of nearly 6% by weight but lowers sharply when the added amount of the magnesium oxide exceeds 6% by weight. Therefore, a sinter having a large counter-theoretical density ratio can be obtained by adding the magnesium oxide in an amount of 0.01 to 5.0% by weight, and a foreign matter (splash) can be prevented from producing when sputtering using the sinter as the target. And, the film, which is also formed using the sinter as the target, is fixed to have hardness in the neighborhood of the maximum value. Furthermore, by setting the added amount of the magnesium oxide to 0.1 to 0.5% by weight, the maximum counter-theoretical density ratio can be given to the sinter, the sinter having a large counter-theoretical density can be obtained stably, and a foreign matter (splash) can be prevented securely from producing when sputtering using the sinter as the target. And, the film, which is also formed using the sinter as the target, is fixed securely to have hardness in the neighborhood of the maximum value. The results shown in FIG. 6 show substantially the same tendency regardless of a type of sputtering.

Generally, the amount and composition of the magnesium contained in the protective layer and the heat-generating resistor's primer layer are variable even if the same target is used because the sputtering ratio is variable depending on the sputtering method and environments represented by a temperature, a phase and the like. But, the thermal printing heads according to the first and second aspects of the invention have the added amount of the magnesium oxide in the powder as the material for the sinter in 0.01 to 5.0% by weight, so that the formed protective layer and heat-generating resistor's primer layer contain 0.01 to 3.0% by atom of magnesium. And, the protective layer and the heat-generating resistor's primer layer have a composition represented by $SiMg_xN_yO_z$ ($0.01 \leq x \leq 1.5$, $0.1 \leq y \leq 3.0$, $0.1 \leq z \leq 2.0$). For the thermal printing head according to the first and second aspect of the invention, the sputtering method can be suitably a radiofrequency (RF) sputtering method, a magnetron sputtering method or a reactive sputtering method.

For the thermal printing head according to the first and second aspect of the invention, a substrate of alumina ceramics or the like is generally used as the supporting substrate but not limited to it. And, when the glaze glass layer is disposed, silicon dioxide or a mixture of silicon dioxide with calcium, barium, aluminum or strontium is, for example, used but not limited to it. But, in order to prevent a resistance value of the thermal printing head from increasing, the glaze glass layer has preferably a glass transition point of 670° C. or more. The glaze glass layer is generally formed to have a thickness of about 10 to 100 $\mu$m. Furthermore, as the heat-generating resistor, nitride of a highly stable metallic material such as nickel, chromium and tantalum and a variety of cermet material such as $Ta-SiO_2$, $Nb-SiO_2$ and $Ti-SiO_2$ can be used as required. Meanwhile, as the electrode, Al, Al—Si, Al—Si—Cu and the like which are generally used are used but not limited to them. And, the heat-generating resistor is generally formed to have a thickness of 0.1 to 1 $\mu$m, and the electrode is formed to have a thickness of about 1 to 3 $\mu$m.

On the thermal printing head according to the first aspect of the invention, the glaze glass layer can be disposed on the supporting substrate in order to increase the keeping force of heat generated from the heat-generating resistor.

A process for producing a thermal printing head according to a third aspect of the invention comprises a step of disposing a heat-generating resistor on a supporting substrate; a step of connecting an electrode to the heat-generating resistor; and a step of covering the heat-generating resistor and the electrode by sputtering with a sinter of powder comprising silicon nitride, silicon dioxide and magnesium oxide having an average particle diameter of 0.1 μm or below used as a target.

According to the process for producing a thermal printing head of the third aspect of the invention, by sputtering with a sinter of powder comprising silicon nitride, silicon dioxide and magnesium oxide having an average particle diameter of 0.1 μm or below used as a target, a foreign matter (splash) due to the target can be prevented from being produced, so that the heat-generating resistor and the electrode can be covered with the protective layer which is prevented from capturing a foreign matter.

And, a process for producing a thermal printing head according to a fourth aspect of the invention comprises a step of disposing a heat-generating resistor on a supporting substrate with a glaze glass layer intervened therebetween; a step of connecting an electrode to the heat-generating resistor; and a step of covering the heat-generating resistor and the electrode by sputtering with a sinter of powder comprising silicon nitride, silicon dioxide and magnesium oxide having an average particle diameter of 0.1 μm or below used as a target.

According to the process for producing the thermal printing head of the fourth aspect of the invention, quantity of heat generated from the heat-generating resistor can be kept by disposing the heat-generating resistor on the supporting substrate with the glaze glass layer intervened therebetween. And, by sputtering with the sinter of the powder comprising silicon nitride, silicon dioxide and magnesium oxide having an average particle diameter of 0.1 μm or below used as the target, a foreign matter (splash) due to the target can be prevented from being produced, so that the heat-generating resistor and the electrode can be covered with the protective layer which is prevented from capturing a foreign matter.

In addition, a process for producing a thermal printing head according to the fifth aspect of the invention comprises a step of disposing a primer layer for a heat-generating resistor on a supporting substrate with a glaze glass layer intervened therebetween by sputtering with a sinter of powder comprising silicon nitride, silicon dioxide and magnesium oxide having an average particle diameter of 0.1 μm or below used as a target; a step of disposing a heat-generating resistor on the primer layer for the heat-generating resistor; a step of connecting an electrode to the heat-generating resistor; and a step of covering the heat-generating resistor and the electrode by sputtering with a sinter of powder comprising silicon nitride, silicon dioxide and magnesium oxide having an average particle diameter of 0.1 μm or below used as a target.

According to the process for producing the thermal printing head of the fifth aspect of the invention, by sputtering with the sinter of the powder comprising silicon nitride, silicon dioxide and magnesium oxide having an average particle diameter of 0.1 μm or below used as the target, a foreign matter (splash) due to the target can be prevented from being produced, so that the heat-generating resistor's primer layer which is prevented from capturing a foreign matter can be formed on the supporting substrate with the glaze glass layer intervened therebetween. And, by sputtering with the sinter of the powder comprising silicon nitride, silicon dioxide and magnesium oxide having an average particle diameter of 0.1 μm or below used as the target, a foreign matter (splash) due to the target can be prevented from being produced, so that the heat-generating resistor and the electrode can be covered with the protective layer which is prevented from capturing a foreign matter.

In the process for producing the thermal printing heads according to the third to fifth aspects of the invention, the protective layer and the heat-generating resistor's primer layer of the thermal printing head are formed by a sputtering method with the sinter of the powder comprising silicon nitride and silicon dioxide to which the magnesium oxide having an average particle diameter of 0.1 μm or below used as the target, preferably an average particle diameter of 0.1 to 0.5 μm, is added, in order to decrease the foreign matter from dispersing from the target. In other words, in the process for producing the thermal printing heads according to the third to fifth aspects of the invention, pores are decreased by the magnesium oxide having an average particle diameter of 0.1 μm or below, preferably an average particle diameter of 0.1 to 0.5 μm, so that the sinter having an enhanced density is prepared as the target. Then, this target is used to conduct sputtering. Since atoms are substantially uniformly consumed from the surface of the sinter as the target and the pores are decreased, a foreign matter is prevented from being produced due to an abnormal electric discharge resulting from fine irregularities on the surface of the sinter. Besides, adhesion and capture of a foreign matter are substantially remedied, and the protective layer and the heat-generating resistor's primer layer having a uniform thickness are formed.

Generally, since nitride has a low volume diffusion rate of component ions as compared with oxide, pores are formed on the sinter, and it is hard to obtain a sinter having a density close to a theoretical density. However, by adding magnesium oxide having an average particle diameter of 0.1 μm or below, and preferably an average particle diameter of 0.1 to 0.5 μm, as a sintering aid, pores formed on the sinter can be decreased, and the density of the sinter can be increased up to about the theoretical density. To improve the density of the sinter to be used as the target, the magnesium oxide is made to have an average particle diameter of 1.0 μm or below. As described above, if the magnesium oxide has an average particle diameter of more than 1.0 μm, it is hard to achieve remarkable improvement of the density of the sinter used as the target. Besides, it is desirable to adjust the powder, which is material for the sinter, to have an average particle diameter of 10 μm or below, and preferably about 1 μm or below. Thus, by adjusting the particle diameter of the powder, the density of the sinter used as the target becomes closer to the theoretical density, production of a foreign matter in sputtering can be prevented effectively, and the protective layer and the heat-generating resistor's primer layer can be formed with the adhesion and capturing of a foreign matter substantially remedied. Furthermore, the formed protective layer and heat-generating resistor's primer layer have good chemical stability and physical properties such as hardness.

And, in the third to fifth aspect of the invention, the magnesium oxide is desirably added in 0.01 to 5.0% by weight, more preferably 0.1 to 0.5% by weight to the powder to be material for the sinter. Where 5.0% by weight or more of the magnesium oxide is added, the sinter has a lowered density with the addition of the magnesium oxide, and the obtained protective layer and heat-generating resistor's primer layer have lowered hardness. And, when the magnesium oxide is added in an amount of 0.01% by weight or below to the powder to be material for the sinter, it becomes hard to obviously improve the density of the sinter used as the target. This point has been described above. Ratios of the silicon nitride and the silicon dioxide in the powder as the material for the sinter are 65 to 80% by weight of silicon nitride in the powder and 35 to 20% by weight of silicon dioxide in the powder.

A recorder according to a sixth aspect of the invention comprises a thermal printing head which has a supporting substrate; a heat-generating resistor disposed on the supporting substrate; an electrode connected to the heat-generating resistor; and a protective layer formed to cover the heat-generating resistor and the electrode by sputtering with a sinter of powder comprising silicon nitride, silicon dioxide and magnesium oxide having an average particle diameter of 1.0 μm or below used as a target.

According to the recorder of the sixth aspect of the invention, by mounting the thermal printing head which has the protective layer formed to cover the heat-generating resistor and the electrode by sputtering with the sinter of powder comprising silicon nitride, silicon dioxide and magnesium oxide having an average particle diameter of 1.0 μm or below used as the target, the thermal printing head can be prevented from being broken or its properties from being degraded resulting from capturing of a foreign matter into the protective layer, so that high-quality record images can be output stably.

A recorder according to a seventh aspect of the invention comprises a thermal printing head which has a supporting substrate; a glaze glass layer disposed on the supporting substrate; a primer layer for a heat-generating resistor which is formed on the glaze glass layer by sputtering with a sinter of powder, which comprises silicon nitride, silicon dioxide and magnesium oxide having an average particle diameter of 1.0 μm or below, used as a target; a heat-generating resistor disposed on the supporting substrate; an electrode connected to the heat-generating resistor; and a protective layer which is formed to cover the heat-generating resistor and the electrode by sputtering with a sinter of powder, which comprises silicon nitride, silicon dioxide and magnesium oxide having an average particle diameter of 1.0 μm or below, used as a target.

According to the recorder of the seventh aspect of the invention, by mounting the thermal printing head formed by forming the heat-generating resistor's primer layer on the glaze glass layer and the protective layer covering the heat-generating resistor and the electrode using sputtering with the sinter of powder comprising silicon nitride, silicon dioxide and magnesium oxide having an average particle diameter of 1.0 μm or below used as the target, the thermal printing head can be prevented from being broken or its properties from being degraded resulting from capturing of a foreign matter into the heat-generating resistor's primer layer and the protective layer, so that high-quality record images can be output stably.

The recorders according to the sixth and seventh aspects of the invention are not limited as far as they are configured to record images on a recording medium with the thermal printing head. Now, FIG. 7 shows a structure of the recorder according to the sixth and seventh aspect of the invention.

As shown in FIG. 7, the recorder in this structure comprises mainly a mechanism section comprising a printing part 21 and a conveying part 22, a control circuit 23 comprising a control part for controlling the mechanism section, an operation panel part 24 connected to the control circuit 23, and a power source 25. And, the printing part 21 comprises a thermal printing head 26 for printing on a transfer medium, a home position detector 27 for positioning of the thermal printing head 26, a head contact solenoid 28 for detecting a contact between the thermal printing head 26 and the transfer medium, a ribbon feed motor 29 for feeding an ink ribbon to the thermal printing head 26, and a spacing motor 30. And, the conveying part 22 comprises a paper feed motor 31 for sending out the transfer medium and a paper end detector 32 for detecting an end of the transfer medium.

In the recorder having this structure, when a record signal is entered, the record signal is converted into record data for printing between CPU mounted on the control circuit 23 and a parallel-serial conversion circuit to drive the respective motors, and the thermal printing head 26 is driven to print according to the record data as well as a control program.

As the form of the recorder, it may be disposed integrally or separately as an image output terminal of information processing equipment such as a computer or in the form of a copy machine in combination with a reader or the like, a facsimile device having transmitting and receiving functions, a stencil printing device used for stencil printing.

A sinter according to an eighth aspect of the invention is produced by sintering powder which comprises silicon nitride, silicon dioxide and magnesium oxide having an average particle diameter of 1.0 μm or below.

In the sinter according to the eighth aspect of the invention, since pores can be decreased by sintering the powder comprising silicon nitride, silicon dioxide and magnesium oxide having an average particle diameter of 1.0 μm or below, the sinter having a density close to a theoretical density can be obtained.

Besides, a sinter according to a ninth aspect of the invention comprises a composition represented by $SiMg_xN_yO_z$ ($0.001 \leq x \leq 0.01$, $0.1 \leq y \leq 2.0$, $0.1 \leq z \leq 0.5$).

In the sinter according to the ninth aspect of the invention, since the pores can be decreased by having the composition represented by $SiMg_xN_yO_z$ ($0.001 \leq x \leq 0.01$, $0.1 \leq y \leq 2.0$, $0.1 \leq z \leq 0.5$), it can have a density close to a theoretical density.

And, a target according to the tenth aspect of the invention is produced by sintering powder which comprises silicon nitride, silicon dioxide and magnesium oxide having an average particle diameter of 1.0 μm or below.

In the target according to the tenth aspect of the invention, since the pores can be decreased by sintering the powder comprising silicon nitride, silicon dioxide and magnesium oxide having an average particle diameter of 1.0 μm or below, the sinter having a density close to a theoretical density can be obtained.

A target according to an eleventh aspect of the invention comprises a composition represented by $SiMg_xN_yO_z$ ($0.001 \leq x \leq 0.01$, $0.1 \leq y \leq 2.0$, $0.1 \leq z \leq 0.5$).

In the target according to the eleventh aspect of the invention, since the pores can be decreased by having the composition represented by $SiMg_xN_yO_z$ ($0.001 \leq x \leq 0.01$, $0.1 \leq y \leq 2.0$, $0.1 \leq z \leq 0.5$), it can have a density close to a theoretical density.

With the sinter according to the eighth aspect of the invention and the target according to the tenth aspect of the invention, by adding the magnesium oxide having an average particle diameter of 1.0 μm or below, preferably an average particle diameter of 0.1 to 0.5 μm, pores formed on the sinter and the target can be decreased, and a density can be increased to the neighborhood of the theoretical density. The magnesium oxide is added to be 0.01 to 5.0% by weight, more preferably 0.1 to 0.5% by weight of the powder to be the material for the sinter and the target. When the added amount of the magnesium oxide to the powder to be the material for the sinter and the target is 0.01% by weight or below, it is hard to conspicuously improve the densities of the sinter and the target. And, when the added amount of the magnesium oxide to the powder is 5.0% by weight or more, the densities of the sinter and the target are lowered with the addition of the magnesium oxide, and the hardness of the film formed from the target is lowered. And, as to a ratio of silicon nitride and silicon dioxide in the powder, silicon nitride is 65 to 80% by weight in the powder, and silicon dioxide is 35 to 20% by weight in the powder. In sintering the powder, the powder is preferably adjusted to have an average particle diameter of 10 μm or below, and more desirably about 1 μm or below. Thus, by adjusting the particle diameter of the powder, the densities of the sinter and the target can be further made closer to the neighborhood of the theoretical density.

When the sinter and the target are produced, the powder as the material for the sinter and the target may be mixed after adjusting each component to have a predetermined particle diameter in advance, or the powder may be mixed after each component is mixed, pulverized by, for example, a ball mill or the like and mixed, to adjust into a predetermined particle diameter. The sintering is generally conducted by cold pressing the powder and sintering at about 1700° C. for several hours but not limited particularly as far as the densities of the sinter and the target to be obtained can be increased, and press sintering can also be used, for example. The sinter and the target thus produced have composition represented by $SiMg_xN_yO_z$ ($0.001 \leq x \leq 0.01$, $0.1 \leq y \leq 2.0$, $0.1 \leq z \leq 0.5$). And, in the sinters according to the eighth and ninth aspects of the invention and the targets according to the tenth and eleventh aspects of the invention, the sinters and the targets can be increased to have a density of 80 to 95% of a counter-theoretical density ratio (a ratio to the maximum density theoretically calculated).

BEST MODE FOR CARRYING OUT THE INVENTION

Figure 1:
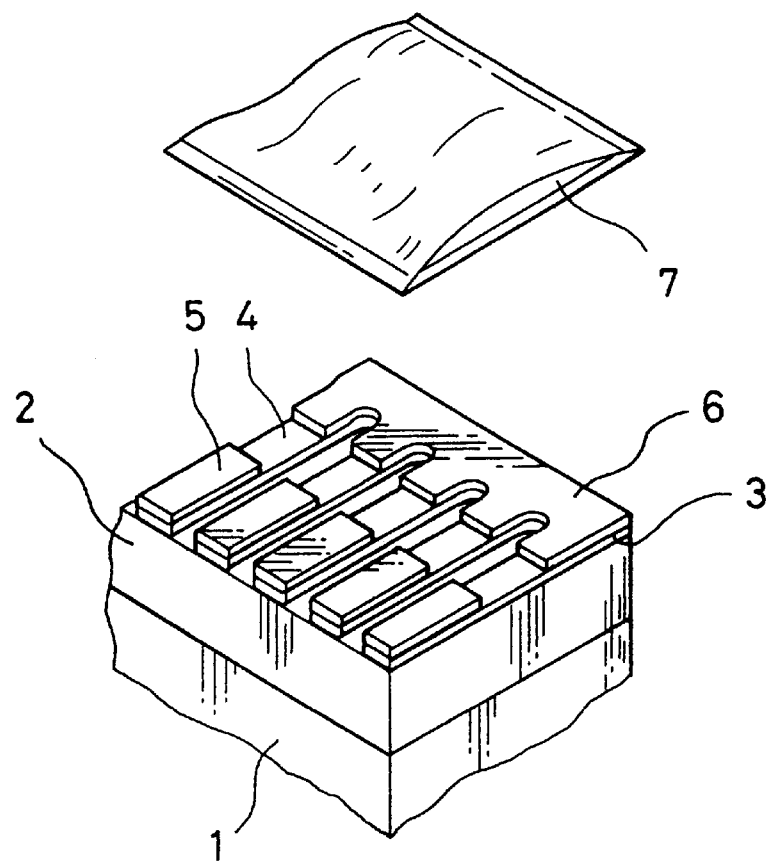
FIG. 1 is a diagram showing one embodiment of the thermal printing head according to the invention.

Referring to the drawings, embodiments of the invention will be described in detail. Through the respective drawings, like reference numerals are given to like components.

Example 1 and Comparative Example 1

FIG. 1 is a diagram showing one embodiment of the thermal printing head according to the invention.

A glaze glass layer 2 comprising silicon dioxide was disposed on an alumina-ceramics supporting substrate 1. Then, a heat-generating resistor layer 3 comprising Ta—$SiO_2$ was formed on the glaze glass layer 2. Separate electrodes 5 and a common electrode 6 comprising Al—Si were formed by a photoengraving process so that a heat-generating part 4 was formed on the heat-generating resistor layer 3. And, a protective layer 7 for covering the heat-generating part 4, the separate electrodes 5 and the common electrode 6 was formed as follows.

First, powder, which comprises 74.6% by weight of silicon nitride having an average particle diameter of 1 μm, 24.9% by weight of silicon dioxide having an average particle diameter of 1 μm and 0.5% by weight of the magnesium oxide having an average particle diameter of 0.5 μm, was mixed in a ball mill to prepare a sintering material (Example 1). Meanwhile, powder, which comprises 75% by weight of silicon nitride having an average particle diameter of 1 μm and 25% by weight of silicon dioxide having an average particle diameter of 1 μm was mixed in a ball mill by a conventional manner to prepare a sintering material (Comparative Example 1). The silicon nitride and the magnesium oxide had a purity of 99.99%, and the silicon dioxide had a purity of 99.9%.

Then, after cold pressing the prepared sintering materials under a pressure of 10 MPa, the sintering materials were kept to sinter in an atmosphere of nitrogen at 1 atmospheric pressure at a temperature of about 1700° C. for five hours, thereby obtaining sinters of 810 mm×145 mm×10 mm, namely targets. These sinters were measured for a density according to the Archmedian method to find that they had 2.6 g/cm³ (Example 1, a counter-theoretical density ratio of about 90%) and 1.6 g/cm³ (Comparative Example 1, a counter-theoretical density ratio of about 55%), showing that the addition of the magnesium oxide highly improved the densities of the sinters.

Figure 2:
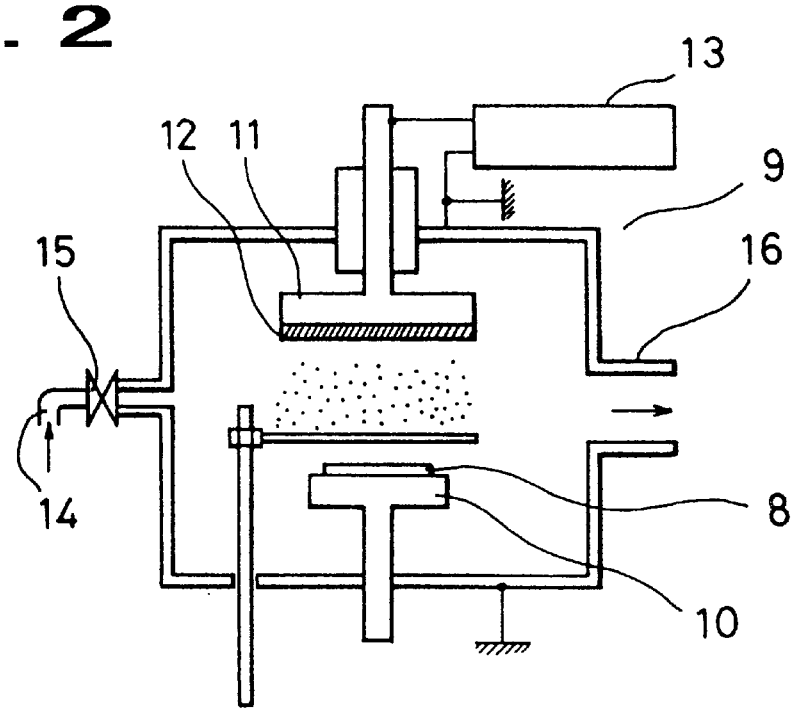
FIG. 2 is a diagram showing a sputtering device.

Successively, using such sinters as the target, the protective layer 7 was formed by radiofrequency bipolar sputtering as shown in FIG. 2. Specifically, a thermal printing head 8 having the separate electrodes 5 and the common electrode 6 was placed on a stand 10 in a sputtering device 9, and a sample was evaporated from a target 12 held by a target holder 11 to form the protective layer 7 for covering the heat-generating part 4, the separate electrodes 5 and the common electrode 6 of the thermal printing head. In FIG. 2, 13 is an RF power source, 14 is a gas introduction port, 15 is a leak valve for adjusting a gas flow, and 16 is a gas discharge port. And, the sputtering was performed in an atmosphere of argon (a flow rate of 250 sccm), under conditions of a pressure of 0.3 to 0.47 Pa, applying power of 3 to 5 kW for four hours. And, a distance between the target and the heat-generating part 4, the separate electrodes 5 and the common electrode 6 was about 4.0 cm. Thus, the thermal printing head with the formed protective film having a thickness of about 3 μm was obtained.

The two formed protective layers 7 were measured for the number of captured foreign matters by observing through a microscope to find that the protective layer 7 (Example 1) formed using the target with the magnesium oxide added had the decreased number of captured foreign matters to about 1/10 as compared with the protective layer 7 (Comparative Example 1) formed using the conventional target.

And, when the respective protective layers 7 as samples were elementary analyzed with a mass spectrometer, 1 atm % of magnesium and 42, 25 and 35 atm % of silicon, oxygen and nitrogen respectively were detected in the protective layer 7 of Example 1. On the other hand, in the protective layer 7 of Comparative Example 1, silicon, oxygen and nitrogen were detected in a ratio of 42, 26 and 32 atm %, respectively.

Furthermore, when the respective protective layers 7 were measured for Knoop hardness and Vickers hardness, it was found that the protective layer 7 (Example 1) formed of the target with the magnesium oxide added had increased hardness as compared with the protective layer 7 (Comparative Example 1) formed of the conventional target. This is assumed that since the sinter, which had a highly improved density by addition of the magnesium oxide, was the target for sputtering, the formed protective layer had an enhanced density as compared with the conventional protective layer.

Subsequently, when a step stress test was conducted using each thermal printing head having the individual protective layer 7, the protective layer 7 (Example 1) formed of the target with the magnesium oxide added had an improved crack resistance and a long service life as compared with the protective layer 7 (Comparative Example 1) formed of the conventional target.

In addition, a thermal pulse was applied to each thermal printing head having the individual protective layer 7 to examine a change in a resistance value, and it was found that as compared with a thermal printing head having the protective layer 7 (Comparative Example 1) formed of a conventional target, the thermal printing head having the protective layer 7 (Example 1) formed of the target with the magnesium oxide added had a less change in the resistance value and an improved property.

Figure 7:
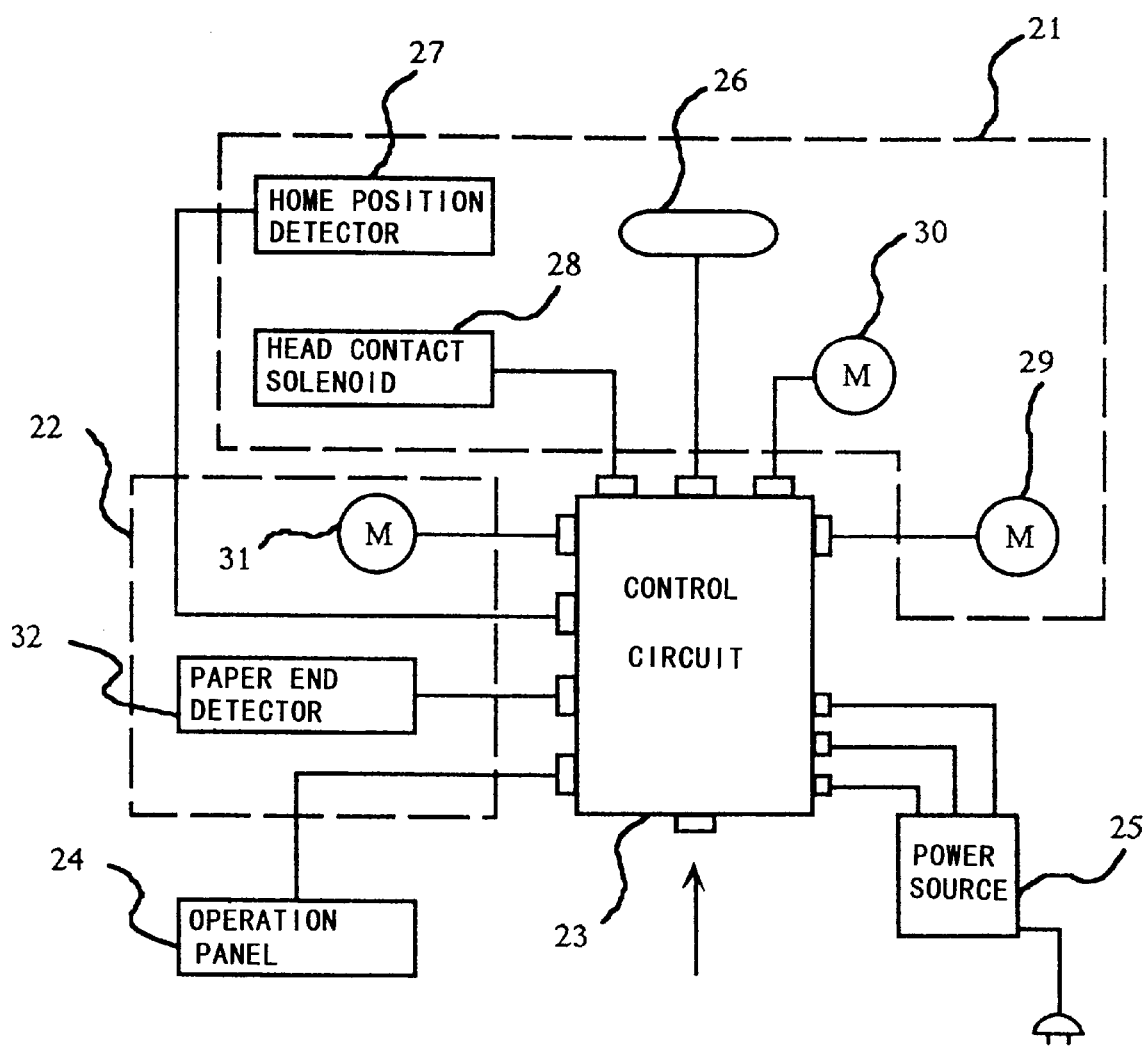
FIG. 7 is a diagram showing one structure of a recorder.

When the thermal printing heads of Example 1 and Comparative Example 1 were mounted on the recorder shown in FIG. 7 to print, the recorder having the thermal printing head of Example 1 could output high-quality record images for a long period as compared with the recorder having the thermal printing head of Comparative Example 1.

Example 2 and Comparative Example 2

Figure 3:
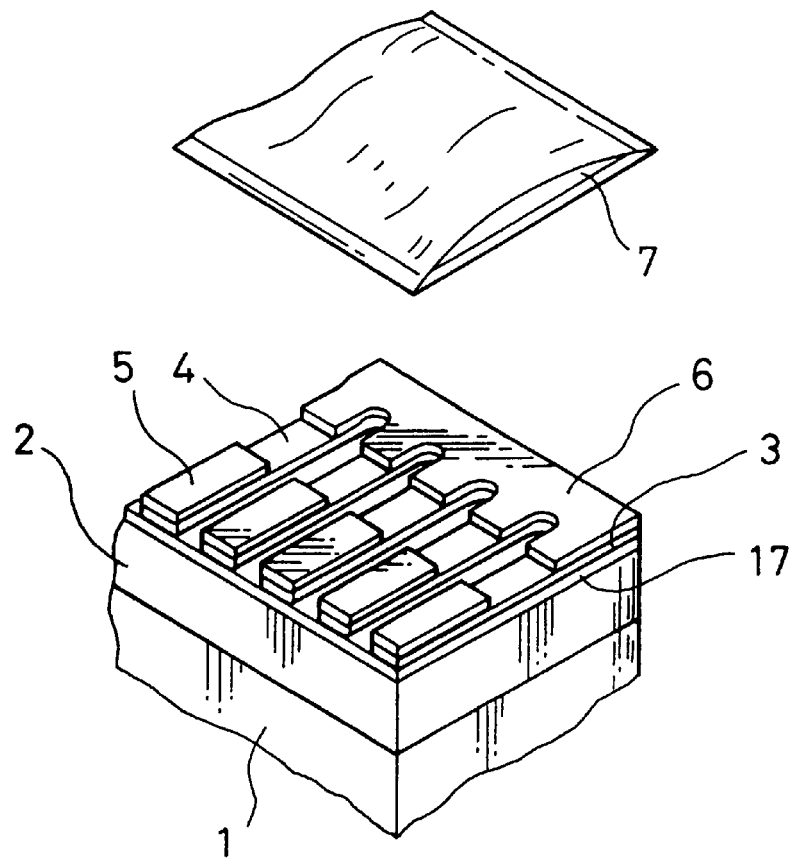
FIG. 3 is a diagram showing another embodiment of the thermal printing head according to the invention.
Figure 4:
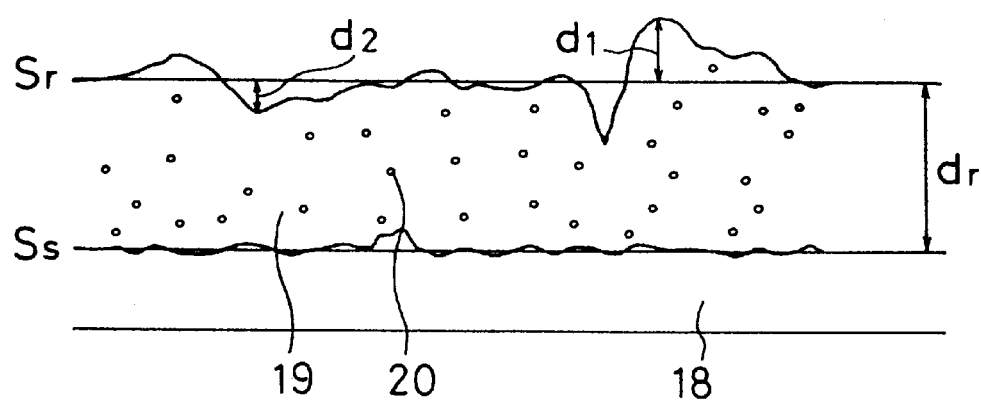
FIG. 4 is a diagram conceptually showing a film thickness.
Figure 5:
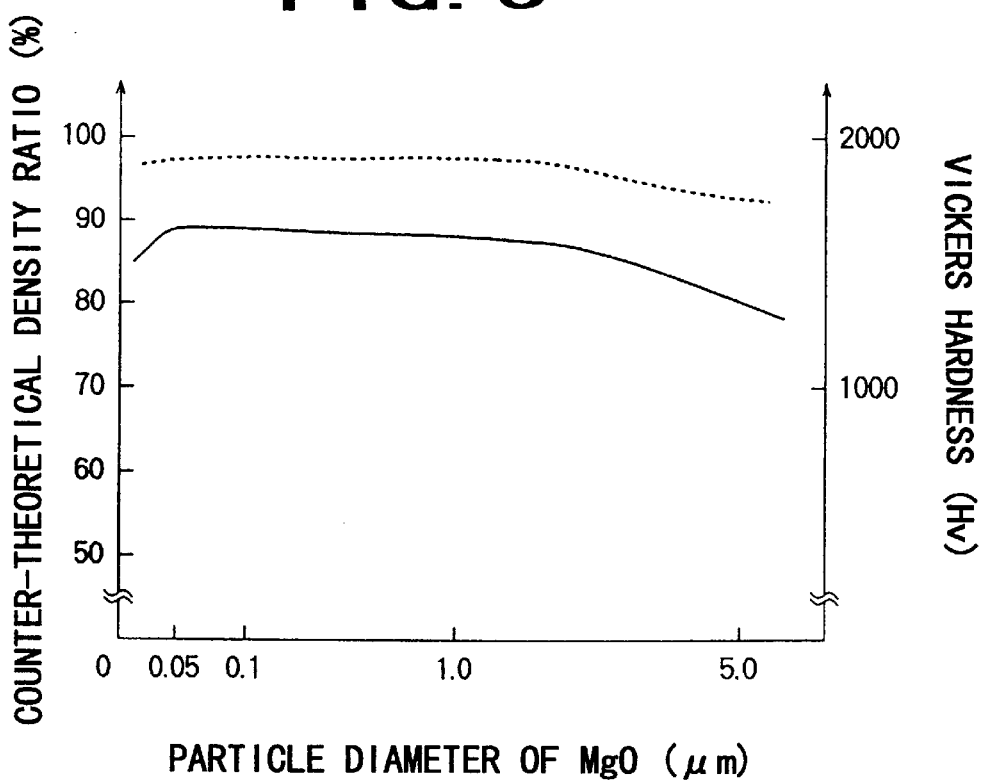
FIG. 5 is a diagram showing the relationship between an average particle diameter of magnesium oxide added to powder which is a material for a sinter and a density of the sinter, and the relationship between an average particle diameter of the magnesium oxide and a hardness of the film formed by using the sinter as a target obtained by adding the magnesium oxide.
Figure 6:
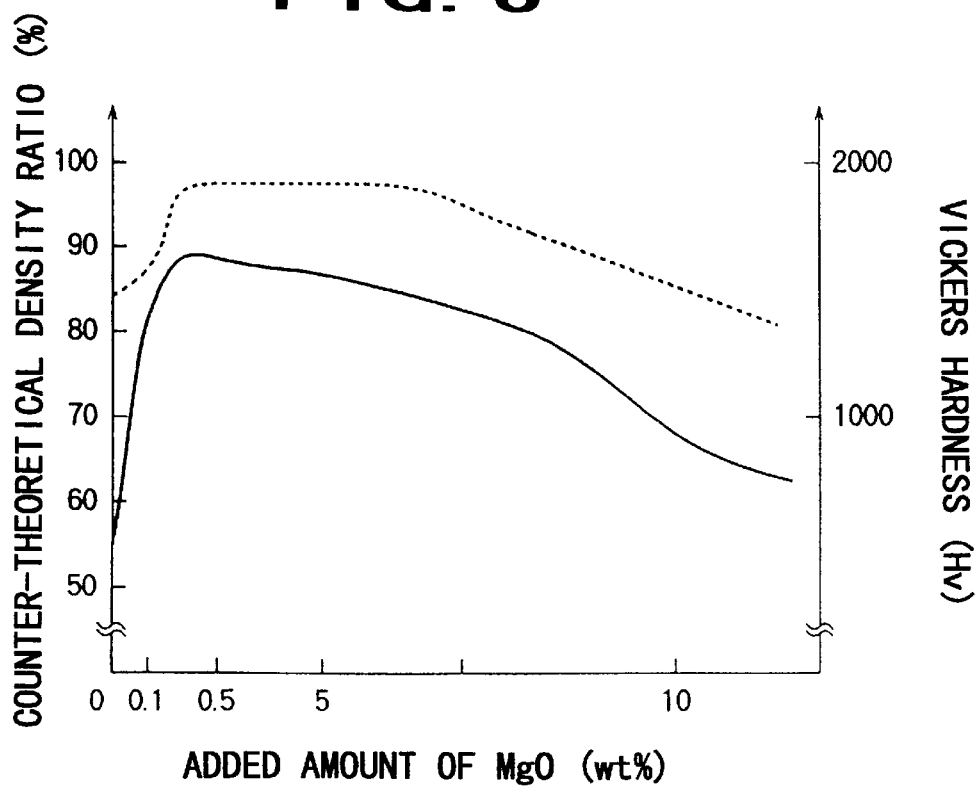
FIG. 6 is a diagram showing the relationship between an amount of magnesium oxide added to powder which is a material for a sinter and a density of the sinter, and the relationship between the added amount of the magnesium oxide and a hardness of the film formed by using the sinter as a target obtained by adding the magnesium oxide.

FIG. 3 is a diagram showing another embodiment of the invention.

A glaze glass layer 2 comprising silicon dioxide was disposed on an alumina-ceramics supporting substrate 1. Then, a primer layer 17 for a heat-generating resistor was formed to have a thickness of about 4 $\mu$m on the glaze glass layer 2, namely, a primer layer 17 (Example 2) for a heat-generating resistor formed by using the same target material as in Example 1 and a primer layer 17 for a heat-generating resistor (Comparative Example 2) formed by using the same target material as in Comparative Example 1. The sputtering was performed using the apparatus shown in FIG. 2, and the sputtering conditions were also the same as those in Example 1 and Comparative Example 1.

The prepared two types of heat-generating resistor's primer layers 17 were observed through a microscope to count the number of captured foreign matters, and it was found that the heat-generating resistor's primer layer 17 (Example 2) which was formed of the target with the magnesium oxide added had the number of captured foreign matters decreased to about 1/10 as compared with the heat-generating resistor's primer layer 17 (Comparative Example 2) which was formed of the conventional target.

And, when the respective heat-generating resistor's primer layers 17 as samples were elementary analyzed with a mass spectrometer, 1 atm % of magnesium and 42, 25 and 32 atm % of silicon, oxygen and nitrogen respectively were detected. On the other hand, in the heat-generating resistor's primer layer 17 of Comparative Example 2, silicon, oxygen and nitrogen were detected in a ratio of 42, 26 and 32 atm %, respectively. Furthermore, when the respective heat-generating resistor's primer layers 17 were measured for Knoop hardness and Vickers hardness, it was found that the heat-generating resistor's primer layer (Example 2) formed of the target with the magnesium oxide added had increased hardness as compared with the heat-generating resistor's primer layer 17 (Comparative Example 2) formed of the conventional target.

Then, the heat-generating resistor Layer 3 comprising Ta—$SiO_2$ was formed on the respective heat-generating resistor's primer layer 17, and separate electrodes 5 and a common electrode 6 formed of Al—Si were formed by a photoengraving process so that the heat-generating part 4 was formed on the heat-generating resistor layer 3.

Subsequently, the protective layer 7 for covering the heat-generating part 4, the separate electrodes 5 and the common electrode 6 was formed in Example 2 in the same way as in Example 1 and also formed in Comparative Example 2 in the same way as in Comparative Example 1.

As to the two types of protective layers 7 formed, the prepared two types of protective layers 7 were observed through a microscope to count the number of captured foreign matters, and it was found that the protective layer 7 (Example 2) formed of the target with the magnesium oxide added had the number of captured foreign matters decreased to about 1/10 as compared with the protective layer 7 (Comparative Example 2) formed of the conventional target material.

And, when the respective protective layers 7 as samples were elementary analyzed with a mass spectrometer, 1 atm % of magnesium and 42, 25 and 32 atm % of silicon, oxygen and nitrogen respectively were detected in the protective layer 7 of Example 2. On the other hand, in the protective layer 7 of Comparative Example 2, silicon, oxygen and nitrogen were detected in a ratio of 42, 26 and 32 atm %, respectively.

Furthermore, when the respective protective layers 7 were measured for Knoop hardness and Vickers hardness, it was found that the protective layer 7 (Example 2) formed of the target with the magnesium oxide added had increased hardness as compared with the protective layer 7 (Comparative Example 2) formed of the conventional target. This is assumed that since the sinter, which had a highly improved density by addition of the magnesium oxide, was the target for sputtering, the formed protective layer had an enhanced density as compared with the conventional protective layer.

Subsequently, when a step stress test was conducted using each thermal printing head having the individual heat-generating resistor's primer layer 17 and the protective layer 7, it was found that the protective layer 7 (Example 2) formed of the target with the magnesium oxide added had an improved crack resistance and a long service life as compared with the protective layer 7 (Comparative Example 2) formed of the conventional target.

And a thermal pulse was applied to each thermal printing head having the heat-generating resistor's primer layer 17 and the protective layer 7 to examine a change in a resistance value, and it was found that as compared with a thermal printing head having the conventional protective layer 7 and the heat-generating resistor's primer layer 17 (Comparative Example 2), the thermal printing head having the protective layer 7 and the heat-generating resistor's primer layer 17 (Example 2) formed of the target with the magnesium oxide added had a less change in the resistance value and the properties improved. Besides, the thermal printing head shown in Example 2 had a change in the resistance value additionally decreased as compared with the thermal printing head as shown in Example 1. This is assumed that since the sinter which had a substantially improved density by addition of the magnesium oxide was the target for sputtering, the formed heat-generating resistor's primer layer was prevented from having a defect, and oxygen or the like was effectively prevented from dispersing from the glaze glass layer to the heat-generating resistor layer.

And, when the thermal printing heads of Example 2 and Comparative Example 2 were mounted on the recorder shown in FIG. 7 to print, the recorder having the thermal printing head of Example 2 could output high-quality record images for a long period as compared with the recorder having the thermal printing head of Comparative Example 2.

Example 3

The thermal printing head shown in FIG. 1 was produced. Specifically, a glaze glass layer 2 comprising silicon dioxide was disposed on an alumina-ceramics supporting substrate 1. Then, a heat-generating resistor layer 3 comprising $Ta—SiO_2$ was formed on the glaze glass layer 2. Separate electrodes 5 and a common electrode 6 formed of Al—Si were formed by a photoengraving process so that a heat-generating part 4 was formed on the heat-generating resistor layer 3. And, a protective layer 7 for covering the heat-generating part 4, the separate electrodes 5 and the common electrode 6 was formed as follows.

First, powder comprising 74.6% by weight of silicon nitride having an average particle diameter of 1 $\mu$m, 24.9% by weight of silicon dioxide having an average particle diameter of 1 $\mu$m and 0.5% by weight of magnesium oxide having an average particle diameter of 0.05 $\mu$m was mixed in respective ball mills to prepare sintering materials. The silicon nitride and the magnesium oxide had a purity of 99.99%, and the silicon dioxide had a purity of 99.9%.

Then, by following the procedure of Example 1, sinters of 810 mm×145 mm×10 mm, namely targets, were prepared. These sinters were measured for a density according to the Archmedian method to find that they had 2.43 g/cm$^3$ (Example 3, a counter-theoretical density ratio of about 85%), showing that a difference was not so substantial from Example 1 where the magnesium oxide had an average particle diameter of 0.5 $\mu$M.

Subsequently, in the same way as in Example 1, the protective layer 7 was formed to cover the heat-generating part 4, the separate electrodes 5 and the common electrode 6 of the thermal printing head 8. The formed protective film 7 had a thickness of about 3 $\mu$m.

The formed protective layers 7 were measured for the number of foreign matters captured by observing through a microscope to find that the protective layer 7 of Example 3 formed using the target with the magnesium oxide adjusted to have an average particle diameter of 0.05 $\mu$m had the number of captured foreign matters not largely different from the number of captured foreign matters in the protective layer 7 of Example 1.

And, when the respective protective layers 7 as samples were elementary analyzed with a mass spectrometer, 1, 42, 25 and 32 atm % of magnesium, silicon, oxygen and nitrogen respectively were detected in the protective layer 7 of Example 3.

Furthermore, when the respective protective layers 7 were measured for Knoop hardness and Vickers hardness, it was found that the protective layer 7 of Example 7 formed using the target with the magnesium oxide adjusted to have an average particle diameter of 0.05 $\mu$m did not have a large difference from hardness of the protective layer 7 of Example 1.

Then, when a step stress test was conducted using each thermal printing head having the individual protective layer 7, the protective layer 7 of Example 3 formed of the target prepared from the sintering material with the magnesium oxide adjusted to have an average particle diameter of 0.05 $\mu$m did not have a large difference from hardness of the protective layer 7 of Example 1.

Besides, a thermal pulse was applied to each thermal printing head having the protective layer 7 to examine a change in a resistance value, and it was found that as compared with the thermal printing head of Example 1, the thermal printing head had almost the same properties.

And, when the thermal printing head of Example 3 was mounted on the recorder configured as shown in FIG. 7 to print, it could output high-quality record images for substantially the same period as compared with the recorder having the thermal printing head of Example 1.

Thus, it was found that when the magnesium oxide added to the sintering material has an average particle diameter of less than 1 $\mu$m, the properties of the thermal printing head and quality of record images outputted from the recorder were substantially same.

Example 4 and Comparative Example 3

The thermal printing head shown in FIG. 1 was produced. Specifically, a glaze glass layer 2 comprising silicon dioxide was disposed on an alumina-ceramics supporting substrate 1. Then, a heat-generating resistor layer 3 comprising $Ta—SiO_2$ was formed on the glaze glass layer 2. Separate electrodes 5 and a common electrode 6 formed of Al—Si were formed by a photoengraving process so that a heat-generating part 4 was formed on the heat-generating resistor layer 3. And, a protective layer 7 for covering the heat-generating part 4, the separate electrodes 5 and the common electrode 6 was formed as follows.

First, powder comprising 74.6% by weight of silicon nitride having an average particle diameter of 1 $\mu$m, 24.9% by weight of silicon dioxide having an average particle diameter of 1 $\mu$m and 0.5% by weight of magnesium oxide having an average particle diameter of 1.0 $\mu$m (Example 4) and powder comprising 74.6% by weight of silicon nitride having an average particle diameter of 1 $\mu$m, 24.9% by weight of silicon dioxide having an average particle diameter of 1 $\mu$m and 0.5% by weight of magnesium oxide having an average particle diameter of 5.0 $\mu$m (Comparative Example 3) were individually mixed in a ball mill to prepare sintering materials. The silicon nitride and the magnesium oxide had a purity of 99.99%, and the silicon dioxide had a purity of 99.9%.

Then, by following the procedure of Example 1, sinters of 810 mm×145 mm×10 mm, namely targets, were prepared. These sinters were measured for a density according to the Archmedian method to find that they had 2.43 g/cm$^3$ (Example 4, a counter-theoretical density ratio of about 85%) and 2.25 g/cm$^3$ (Comparative Example 3, a counter-theoretical density ratio of about 79%), indicating that magnesium oxide adjusted to have an average particle diameter of 1.0 $\mu$m resulted in a density higher than when magnesium oxide was adjusted to have an average particle diameter of 5.0 $\mu$m.

Subsequently, in the same way as in Example 1, the protective layer 7 was formed to cover the heat-generating part 4, the separate electrodes 5 and the common electrode 6 of the thermal printing head 8. The formed protective film 7 had a thickness of about 3 μm.

The formed two types of protective layers 7 were measured for the number of captured foreign matters by observing through a microscope to find that the protective layer 7 (Example 4) formed using the target prepared from the sintering material with the magnesium oxide adjusted to have an average particle diameter of 1.0 μm had the number of captured foreign matters reduced to about 1/1.5 as compared with the protective layer 7 (Comparative Example 3) formed of the target prepared from the sintering material with magnesium oxide adjusted to have an average particle diameter of 5.0 μm.

And, when the respective protective layers 7 as samples were elementary analyzed with a mass spectrometer, 1.0, 42, 25 and 32 atm % and 1.5%, 42.5, 24 and 31 atm % of magnesium, silicon, oxygen and nitrogen respectively were detected in the protective layers 7 of Example 4 and Comparative Example 3.

Furthermore, when the respective protective layers 7 were measured for Knoop hardness and Vickers hardness, it was found that the protective layer 7 (Example 4), which was formed using the target prepared from the sintering material with the magnesium oxide adjusted to have an average particle diameter of 1.0 μm, had increased hardness as compared with hardness of the protective layer 7 (Comparative Example 3) formed of the target prepared from the sintering material with the magnesium oxide adjusted to have an average particle diameter of 5.0 μm. This is assumed that since the sinter, which had a substantially improved density by addition of the magnesium oxide with an average particle diameter adjusted to 1.0 μm, was used as the target for sputtering, the formed protective layer had an increased density in Example 4.

Then, when a step stress test was conducted using each thermal printing head having the individual protective layer 7, the protective layer 7 (Example 4), which was formed of the target prepared from the sintering material with the magnesium oxide adjusted to have a particle diameter of 1.0 μm, had an improved crack resistance and a long service life as compared with the protective layer 7 of Comparative Example 3.

Besides, a thermal pulse was applied to each thermal printing head having the individual protective layer 7 to examine a change in a resistance value, and it was found that as compared with the thermal printing head of Comparative Example 3, the thermal printing head of Example 4 had a less change in the resistance value and an improved property.

And, when the thermal printing heads of Example 4 and Comparative Example 3 were mounted on the recorder configured as shown in FIG. 7 to print, the recorder having the thermal printing head of Example 4 could output high-quality record images for a long period as compared with the recorder having the thermal printing head of Comparative Example 3.

Example 5 and Comparative Example 4

The thermal printing head shown in FIG. 1 was produced. Specifically, a glaze glass layer 2 comprising silicon dioxide was disposed on an alumina-ceramics supporting substrate 1. Then, a heat-generating resistor layer 3 comprising Ta—SiO$_2$ was formed on the glaze glass layer 2. Separate electrodes 5 and a common electrode 6 formed of Al—Si were formed by a photoengraving process so that a heat-generating part 4 was formed on the heat-generating resistor layer 3. And, a protective layer 7 for covering the heat-generating part 4, the separate electrodes 5 and the common electrode 6 was formed as follows.

First, powder, which comprises 74.85% by weight of silicon nitride having an average particle diameter of 1 μm, 25.1% by weight of silicon dioxide having an average particle diameter of 1 μm and 0.05% by weight of magnesium oxide having an average particle diameter of 0.5 μm, was mixed in a ball mill to prepare a sintering material (Example 5). Meanwhile, powder, which comprises 74.895% by weight of silicon nitride having an average particle diameter of 1 μm, 25.1% by weight of silicon dioxide having an average particle diameter of 1 μm and 0.005% by weight of magnesium oxide having an average particle diameter of 0.5 μm, was mixed in a ball mill to prepare a sintering material (Comparative Example 5). The silicon nitride and the magnesium oxide had a purity of 99.99%, and the silicon dioxide had a purity of 99.9%.

Then, by following the procedure of Example 1, sinters of 810 mm×145 mm×10 mm, namely targets, were prepared. These sinters were measured for a density according to the Archmedian method to find that they had 2.00 g/cm$^3$ (Example 5, a counter-theoretical density ratio of about 70%) and 1.70 g/cm$^3$ (Comparative Example 4, a counter-theoretical density ratio of about 60%), showing that the sinter of Example 5 had a substantially improved density as compared with that of the sinter of Comparative Example 4.

Subsequently, in the same way as in Example 1, the protective layer 7 was formed to cover the heat-generating part 4, the separate electrodes 5 and the common electrode 6 of the thermal printing head 8. The formed protective film 7 had a thickness of about 3 μm.

The formed two types of protective layers 7 were measured for the number of foreign matters captured by observing through a microscope to find that the protective layer 7 (Example 5) formed using the target prepared with magnesium oxide added in 0.05% by weight had the number of captured foreign matters reduced to about 1/10 as compared with the protective layer 7 (Comparative Example 4) formed of the target prepared with magnesium oxide added in 0.005% by weight.

And, when the respective protective layers 7 as samples were elementary analyzed with a mass spectrometer, 1.0 atm % of magnesium and 45, 25 and 30 atm % of silicon, oxygen and nitrogen respectively were detected in the protective layer 7 of Example 5. Meanwhile, 0.1 atm % of magnesium and 46, 27 and 27 atm % of silicon, oxygen and nitrogen respectively were detected in the protective layer 7 of Comparative Example 5.

Furthermore, when the respective protective layers 7 were measured for Knoop hardness and Vickers hardness, it was found that the protective layer 7 (Example 5), which was formed using the target prepared from the sintering material with the magnesium oxide added in 0.05% by weight, had increased hardness as compared with hardness of the protective layer 7 (Comparative Example 4), which was formed of the target prepared from the sintering material with the magnesium oxide added in 0.005% by weight. This is assumed that since the sinter, which had an improved density by addition of 0.05% by weight of the magnesium oxide to the sintering material, was used as the target for sputtering, the formed protective layer had an increased density in Example 5, while since the magnesium oxide was added in an amount of 0.005% by weight to the sintering material in Comparative Example 4, the improvement of a density of the target was not so obvious as in Example 5, and the density of the formed protective layer was lowered as compared with Example 5.

Then, when a step stress test was conducted using each thermal printing head having the individual protective layer 7, the protective layer 7 (Example 5) formed of the target prepared from the sintering material with the magnesium oxide added in 0.05% by weight had an improved crack resistance and a long service life as compared with the protective layer 7 (Comparative Example 4) formed of the target prepared from the sintering material with magnesium oxide added in 0.005% by weight.

Besides, a thermal pulse was applied to each thermal printing head having the individual protective layer 7 to examine a change in a resistance value, and it was found that as compared with the thermal printing head of Comparative Example 4, the thermal printing head of Example 5 had a less change in the resistance value and the properties improved.

And, when the thermal printing heads of Example 5 and Comparative Example 4 were mounted on the recorder shown in FIG. 7 to print, the recorder having the thermal printing head of Example 5 could output high-quality record images for a long period as compared with the recorder having the thermal printing head of Comparative Example 4.

Example 6 and Comparative Example 5

The thermal printing head shown in FIG. 1 was produced. Specifically, a glaze glass layer 2 comprising silicon dioxide was disposed on an alumina-ceramics supporting substrate 1. Then, a heat-generating resistor layer 3 comprising Ta—$SiO_2$ was formed on the glaze glass layer 2. Separate electrodes 5 and a common electrode 6 formed of Al—Si were formed by a photoengraving process so that a heat-generating part 4 was formed on the heat-generating resistor layer 3. And, a protective layer 7 for covering the heat-generating part 4, the separate electrodes 5 and the common electrode 6 was formed as follows.

First, powder, which comprises 77.1 by weight of silicon nitride having an average particle diameter of 1 μm, 26.9% by weight of silicon dioxide having an average particle diameter of 1 μm and 5.0% by weight of magnesium oxide having an average particle diameter of 0.5 μm, was mixed in a ball mill to prepare a sintering material (Example 6). Meanwhile, powder, which comprises 68.0% by weight of silicon nitride having an average particle diameter of 1 μm, 22.0% by weight of silicon dioxide having an average particle diameter of 1 μm and 10% by weight of magnesium oxide having an average particle diameter of 0.5 μm, was mixed in a ball mill to prepare a sintering material (Comparative Example 5). The silicon nitride and the magnesium oxide had a purity of 99.99%, and the silicon dioxide had a purity of 99.9%.

Then, by following the procedure of Example 1, sinters of 810 mm×145 mm×10 mm, namely targets, were prepared. These sinters were measured for a density according to the Archmedian method to find that they had 2.30 g/cm$^3$ (Example 6, a counter-theoretical density ratio of about 81%) and 1.95 g/cm$^3$ (Comparative Example 5, a counter-theoretical density ratio of about 68%), showing that the sinter of Comparative Example 5 had unexpectedly a tendency of having a reduced counter-theoretical density ratio. Subsequently, in the same way as in Example 1, the protective layer 7 was formed to cover the heat-generating part 4, the separate electrodes 5 and the common electrode 6 of the thermal printing head 8. The formed protective film 7 had a thickness of about 3 μm.

The formed two types of protective layers 7 were measured for the number of captured foreign matters by observing through a microscope to find that the protective layer 7 (Example 6), which was formed using the target prepared from the sintering material with the magnesium oxide added in 5.0% by weight, had the number of captured foreign matters reduced to about 1/10 as compared with the protective layer 7 (Comparative Example 5), which was formed of the target prepared from the sintering material with the magnesium oxide added in 10.0% by weight.

And, when the respective protective layers 7 as samples were elementary analyzed with a mass spectrometer, 2 atm % of magnesium and 41, 24 and 32 atm % of silicon, oxygen and nitrogen respectively were detected in the protective layer 7 of Example 6. Meanwhile, 5 atm % of magnesium and 42, 21 and 32 atm % of silicon, oxygen and nitrogen respectively were detected in the protective layer 7 of Comparative Example 5.

Furthermore, when the respective protective layers 7 were measured for Knoop hardness and Vickers hardness, it was found that the protective layer 7 (Example 5), which was formed using the target prepared from the sintering material with the magnesium oxide added in 10.0% by weight, had a lowered hardness as compared with hardness of the protective layer 7 (Comparative Example 6), which was formed of the target prepared from the sintering material with the magnesium oxide added in 5.0% by weight. This is assumed that with lowering of the density of the protective layer as well as a large amount of magnesium contained in the protective layer, the hardness of the protective layer was lowered.

Then, when a step stress test was conducted using each thermal printing head having the individual protective layer 7, the protective layer 7 (Example 6), which was formed of the target prepared from the sintering material with the magnesium oxide added in 5.0% by weight, had an improved crack resistance and a long service life as compared with the protective layer 7 (Comparative Example 5), which was formed of the target prepared from the sintering material with the magnesium oxide added in 10.0% by weight.

Besides, a thermal pulse was applied to each thermal printing head having the individual protective layer 7 to examine a change in a resistance value, and it was found that as compared with the thermal printing head of Comparative Example 6, the thermal printing head of Example 6 had a less change in the resistance value and an improved property.

And, when the thermal printing heads of Example 6 and Comparative Example 5 were mounted on the recorder configured as shown in FIG. 7 to print, the recorder having the thermal printing head of Example 6 could output high-quality record images for a long period as compared with the recorder having the thermal printing head of Comparative Example 4.

INDUSTRIAL APPLICABILITY

As described above, according to the thermal printing head according to the first aspect of the invention, since the protective layer is formed by sputtering with the sinter of which the powder comprising silicon nitride, silicon dioxide and magnesium oxide having an average particle diameter of 1.0 μm or below used as the target, a high-quality thermal printing head, which has the occurrence of a pinhole in the protective layer and a breakage of the protective layer decreased, an excellent environment resistance, and high reliability, can be provided. Therefore, it is suitably used for a recorder to output high quality record images.

According to the second aspect of the invention, since the protective layer and the heat-generating resistor's primer layer are formed by sputtering with the sinter of the powder comprising silicon nitride, silicon dioxide and magnesium oxide having an average particle diameter of 1.0 μm or below used as the target, a high-quality thermal printing head, which has the occurrence of a pinhole in the protective layer and a breakage of the protective layer and the heat-generating resistor's primer layer decreased, an excellent environment resistance, and high reliability, can be provided. Therefore, it is suitably used for a recorder to output high quality record images.

Furthermore, according to the process for producing the thermal printing head of the third and fourth aspects of the invention, since the protective layer can be formed with a foreign matter suppressed from being captured by sputtering with the sinter of the powder comprising silicon nitride, silicon dioxide and magnesium oxide having an average particle diameter of 1.0 μm or below used as the target, it is suitable to provide a high-quality thermal printing head which has the occurrence of a pinhole in the protective layer and a breakage of the protective layer decreased, an excellent environment resistance, and high reliability.

And, according to the process for producing the thermal printing head of the fifth aspect of the invention, since the protective layer and the heat-generating resistor's primer layer can be formed with a foreign matter suppressed from being captured by sputtering with the sinter of the powder comprising silicon nitride, silicon dioxide and magnesium oxide having an average particle diameter of 1.0 μm or below used as the target, it is suitable to provide a high-quality thermal printing head which has the occurrence of a pinhole in the protective layer and the heat-generating resistor's primer layer and a breakage of the protective layer and the heat-generating resistor's primer layer decreased, an excellent environment resistance, and high reliability.

Furthermore, according to the recorder of the sixth aspect of the invention, since it has a high-quality thermal printing head which has the occurrence of a pinhole in the protective layer and the heat-generating resistor's primer layer and a breakage of the protective layer and the heat-generating resistor's primer layer decreased, an excellent environment resistance and high reliability, it is suitably used for stencil printing and a facsimile for outputting high-quality record images.

And, according to the recorder according to the seventh aspect of the invention, since it has a high-quality thermal printing head which has the occurrence of a pinhole in the protective layer and the heat-generating resistor's primer layer and a breakage of the protective layer and the heat-generating resistor's primer layer decreased, an excellent environment resistance and high reliability, it is suitably used for stencil printing and a facsimile for outputting high-quality record images.

Furthermore, according to the sinter according to the eighth aspect of the invention, since it can achieve reduction of holes and a density close to a theoretical density by sintering the powder comprising silicon nitrogen, silicon dioxide and magnesium oxide having an average particle diameter of 1.0 μm or below, it is suitable for formation of a protective layer, a heat-generating resistor's primer layer and the like for a thermal printing head.

And, according to the sinter according to the ninth aspect of the invention, since it can achieve reduction of holes and a density close to a theoretical density by having a composition represented by $SiMg_xN_yO_z$ ($0.001 \leq x \leq 0.01$, $0.1 \leq y \leq 2.0$, $0.1 \leq z \leq 0.5$), it is suitable for formation of a protective layer, a heat-generating resistor's primer layer and the like for a thermal printing head.

Furthermore, according to the target according to the tenth aspect of the invention, since it can achieve reduction of holes and a density close to a theoretical density by sintering the powder comprising silicon nitrogen, silicon dioxide and magnesium oxide having an average particle diameter of 1.0 μm or below, it is suitable for formation of a protective layer, a heat-generating resistor's primer layer and the like for a thermal printing head.

Besides, according to the target according to the eleventh aspect of the invention, since it can achieve reduction of holes and a density close to a theoretical density by having a composition represented by $SiMg_xN_yO_z$ ($0.001 \leq x \leq 0.01$, $0.1 \leq y \leq 2.0$, $0.1 \leq z \leq 0.5$), it is suitable for formation of a protective layer, a heat-generating resistor's primer layer and the like for a thermal printing head.

What is claimed is:

1. A thermal printing head, comprising:
   a supporting substrate;
   a heat-generating resistor disposed on the supporting substrate;
   an electrode connected to the heat-generating resistor; and
   a protective layer which is formed to cover the heat-generating resistor and the electrode by sputtering with a sinter of powder, which comprises silicon nitride and silicon dioxide as principal components and magnesium oxide having an average particle diameter of 1.0 μm or below, used as a target.

2. The thermal printing head according to claim 1, further comprising a glaze glass layer between the supporting substrate and the electrode.

3. The thermal printing head according to claim 1 or 2, wherein the magnesium oxide contained in the powder has an average particle diameter of 0.1 to 0.5 μm.

4. The thermal printing head according to claim 1 or 2, wherein the powder has 0.01 to 5.0% by weight of the magnesium oxide.

5. The thermal printing head according to claim 1 or 2, wherein the powder has 0.1 to 0.5% by weight of magnesium oxide.

6. The thermal printing head according to claim 1 or 2, wherein the protective layer has 0.01 to 3.0 atm % of magnesium.

7. The thermal printing head according to claim 1 or 2, wherein the protective layer has a composition represented by:

$$SiMg_xN_yO_z \ (0.01 \leq x \leq 1.5, \ 0.1 \leq y \leq 3.0, \ 0.1 \leq z \leq 2.0).$$

8. A thermal printing head, comprising:
   a supporting substrate;
   a glaze glass layer disposed an the supporting substrate;
   a primer layer for a heat-generating resistor, which is formed on the glaze glass layer by sputtering with a sinter of powder, which comprises silicon nitride, silicon dioxide and magnesium oxide having an average particle diameter of 1.0 μm or below, used as a target;
   a heat-generating resistor disposed on the supporting substrate;
   an electrode connected to the heat-generating resistor; and a protective layer which is formed to cover the heat-generating resistor and the electrode by sputtering with a sinter of powder, which comprises silicon nitride and silicon dioxide as principal components and magnesium oxide having an average particle diameter of 1.0 pm or below, used as a target.

9. The thermal printing head according to claim 2, wherein the primer layer for the heat-generating resistor has 0.01 to 3.0 atm % of magnesium.

10. The thermal printing head according to claim 2, wherein the primer layer for the heat-generating resistor has a composition represented by:

$SiMg_xN_yO_z$ (0.01≦x≦1.5, 0.1≦y≦3.0, 0.1≦z≦2.0).

11. A process for producing a thermal printing head, comprising:
   a step of disposing a heat-generating resistor on a supporting substrate;
   a step of connecting an electrode to the heat-generating resistor; and
   a step of covering the heat-generating resistor and the electrode by sputtering with a sinter of powder comprising silicon nitride and silicon dioxide as principal components and magnesium oxide having an average particle diameter of 1.0 μm or below used as a target.

12. The process for producing a thermal printing head according to claim 11, wherein the magnesium oxide of the powder has an average particle diameter of 0.1 to 0.5 μm.

13. The process for producing a thermal printing head according to claim 11, wherein the powder has 0.01 to 5.0% by weight of the magnesium oxide.

14. The process for producing a thermal printing head according to claim 11, wherein the powder has 0.1 to 0.5% by weight of the magnesium oxide.

15. A process for producing a thermal printing head, comprising:
   a step of disposing a heat-generating resistor on a supporting substrate with a glaze glass layer intervened therebetween;
   a step of connecting an electrode to the heat-generating resistor; and
   a step of covering the heat-generating resistor and the electrode by sputtering with a sinter of powder comprising silicon nitride and silicon dioxide as principal components and magnesium oxide having an average particle diameter of 1.0 μm or below used as a target.

16. A process for producing a thermal printing head, comprising:
   a step of disposing a primer layer for a heat-generating resistor an a supporting substrate with a glaze glass layer intervened therebetween by sputtering with a sinter of powder comprising silicon nitride and silicon dioxide as principal components and magnesium oxide having an average particle diameter of 1.0 μm or below used as a target;
   a step of disposing a heat-generating resistor on the primer layer for the heat-generating resistor;
   a step of connecting an electrode to the heat-generating resistor; and
   a step of covering the heat-generating resistor and the electrode by sputtering with a sinter of powder comprising silicon nitride and silicon dioxide as principal components and magnesium oxide having an average particle diameter of 1.0 μm or below used as a target.

17. A recorder, comprising a thermal printing head which has a supporting substrate; a heat-generating resistor disposed on the supporting substrate; an electrode connected to the heat-generating resistor; and a protective layer formed to cover the heat-generating resistor and the electrode by sputtering with a sinter of powder comprising silicon nitride and silicon dioxide as principal components and magnesium oxide having an average particle diameter of 1.0 μm or below used as a target.

18. The recorder according to claim 17, wherein the thermal printing head further has a glaze glass layer between the supporting substrate and the electrode.

19. A recorder, comprising a thermal printing head which has a supporting substrate:
   a glaze glass layer disposed on the supporting substrate;
   a primer layer for a heat-generating resistor which is formed on the glaze glass layer by sputtering with a sinter of powder, which comprises silicon nitride and silicon dioxide as principal components and magnesium oxide having an average particle diameter of 1.0 μm or below, used as a target;
   a heat-generating resistor disposed on the supporting substrate; an electrode connected to the heat-generating resistor; and a protective layer which is formed to cover the heat-generating resistor and the electrode by sputtering with a sinter of powder, which comprises silicon nitride and silicon dioxide as principal components and magnesium oxide having an average particle diameter of 1.0 μm or below, used as a target.

20. A sinter, which is produced by sintering powder which comprises silicon nitride and silicon dioxide as principal components and magnesium oxide having an average particle diameter of 1.0 μm or below.

21. The sinter according to claim 20, wherein the magnesium oxide contained in the powder has an average particle diameter of 0.1 to 0.5 μm.

22. The sinter according to claim 20, wherein the powder has 0.01 to 5.0% by weight of the magnesium oxide.

23. The sinter according to claim 20, wherein the powder has 0.1 to 0.5% by weight of the magnesium oxide.

24. A sinter, comprising a composition represented by $SiMg_xN_yO_z$ (0.001≦x≦0.01, 0.1≦y≦2.0, 0.1≦z≦0.5).

25. A target which is produced by sintering powder which comprises silicon nitride and silicon dioxide as principal components and magnesium oxide having an average particle diameter of 1.0 μm or below.

26. A target, comprising a composition represented by $SiMg_xN_yO_z$ (0.001≦x≦0.01, 0.1≦y≦2.0, 0.1≦z≦0.5).

* * * * *

UNITED STATES PATENT AND TRADEMARK OFFICE
CERTIFICATE OF CORRECTION

PATENT NO. : 6,201,557 B1
DATED : March 13, 2001
INVENTOR(S) : Kitazawa et al.

It is certified that error appears in the above-identified patent and that said Letters Patent is hereby corrected as shown below:

Column 22, claim 8,
Line 59, change "disposed an" to -- disposed on --.

Column 23, claim 16,
Line 52, change "an a supporting" to -- on a supporting --.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*